United States Patent [19]

Matsunaga et al.

[11] Patent Number: 4,744,861

[45] Date of Patent: May 17, 1988

[54] METHOD OF PRODUCING SEMICONDUCTOR DEVICE USING REACTIVE ION ETCHING

[75] Inventors: Daisuke Matsunaga, Yokohama; Yoshikazu Kato, Mizusawa, both of Japan

[73] Assignee: Fujitsu Limited, Kanagawa, Japan

[21] Appl. No.: 924,666

[22] Filed: Oct. 30, 1986

[30] Foreign Application Priority Data

Nov. 8, 1985 [JP] Japan .................. 60-250263

[51] Int. Cl.⁴ .................. H01L 21/306; B44C 1/22; C03C 15/00; C23F 1/02
[52] U.S. Cl. .................. 156/643; 156/644; 156/646; 156/653; 156/656; 156/657; 156/659.1; 156/662; 204/192.37; 252/79.1; 357/67; 357/71; 437/192; 437/193; 437/194; 437/200; 437/228; 437/238; 437/245
[58] Field of Search .................. 204/192.32, 192.37; 252/79.1; 427/38.39, 88–91; 29/571, 576 W, 580, 591; 357/23.1, 41, 42, 49, 65, 67, 71; 156/643, 644, 646, 653, 656, 657, 659.1, 661.1, 662; 437/192, 193, 194, 200, 228, 238, 241, 245

[56] References Cited

U.S. PATENT DOCUMENTS

| | | | |
|---|---|---|---|
| 4,211,601 | 7/1980 | Mogab | 156/643 |
| 4,444,617 | 4/1984 | Whitcomb | 156/657 X |
| 4,450,042 | 5/1984 | Purdes | 156/643 |
| 4,528,066 | 7/1985 | Merkling et al. | 156/657 X |

Primary Examiner—William A. Powell
Attorney, Agent, or Firm—Armstrong, Nikaido, Marmelstein & Kubovcik

[57] ABSTRACT

A method of producing a semiconductor device comprises the steps of forming on a substrate a layer of a material selected from a group consisting of aluminum, aluminum alloy, titanium, polysilicon and a metal silicide, and carrying out a dry etching of the layer in a reactive gas consisting essentially of bromine gas.

12 Claims, 5 Drawing Sheets

METHOD OF PRODUCING SEMICONDUCTOR DEVICE USING REACTIVE ION ETCHING

BACKGROUND OF THE INVENTION

The present invention generally relates to methods of producing semiconductor devices using reactive ion etching (hereinafter simply referred to as RIE), and more particularly to a method of producing a semiconductor device using a predetermined gas which at least includes ($Br_2$) gas as a reactive gas for the RIE, so as to improve the patterning accuracy.

Photolithography and electron beam lithography techniques are used for producing minute electronic circuits such as semiconductor parts including integrated circuits (ICs) and large scale integrated circuits (LSIs), and circuit parts including magnetic bubble memories and surface wave filters. When forming a circuit part on a substrate, metal and insulator layers are formed on the substrate by a vacuum deposition, a chemical vapor deposition and the like. A photoresist layer is formed on the metal and insulator layers on the substrate, and the photoresist layer is exposed by a projection exposure or a contact exposure. In the case where a positive photoresist is used for the photoresist layer, exposed portions of the photoresist layer are dissolved. On the other hand, in the case where a negative photoresist is used for the photoresist layer, non-exposed portions of the photoresist layer are dissolved. A pattern formed by the remaining photoresist layer is used as a mask to carry out a patterning process by an etching.

The etching can be divided into a wet etching which carries out the etching process chemically, and a dry etching which carries out the etching process physically. At first, the wet etching was preferred, but as the integration density of devices improved, the wet etching caused problems in that the so-called side etching phenomenon occurred due to the chemical etching. The side etching phenomenon is a phenomenon in which a side wall of a layer is etched in excess because there is no anisotropy in the chemical etching. For this reason, the dry etching, especially the RIE, is now popularly used since it is possible to carry out an anisotropic etching which does not cause the side etching phenomenon.

The RIE is carried out as follows. The substrate is placed on a cathode which is coupled to a radio frequency generator for generating a high frequency voltage of 13.56 MHz, for example. A glow discharge is generated inside an etching chamber so as to introduce a voltage drop in the cathode voltage in accordance with a difference in mobilities of ions and electrons in the plasma due to the glow discharge. The RIE uses positive ions in the gas plasma which hit the substrate on the cathode due to this voltage drop.

Conventionally, a halide such as carbon tetrafluoride ($CF_4$), carbon tetrachloride ($CCl_4$) and methane trifluoride ($CHF_3$) is used as a reactive gas. The $F+$ and $Cl+$ ions in the plasma are highly reactive, and these ions react with the metal and insulator layers on the substrate to effect the etching. The positive ions of the halide react with the materials on the substrate and form a halide gas, but the dry etching progresses because the halide gas is easily evacuated out of the etching chamber due to the high vapor pressure.

As one example of the use of the RIE, there is the case where a wiring pattern is formed by the RIE. In this case, an aluminum (Al) layer is formed on a phospho-silicate glass (PSG) layer and over a contact hole in the PSG layer, and a photoresist layer is formed on the Al layer. The PSG layer is formed on a semiconductor substrate, and an impurity region is formed in the semiconductor substrate under the contact hole. The photoresist layer is patterned in accordance with the wiring pattern which s to be formed, and the wiring pattern of the Al layer is formed by the RIE using the photoresist layer as a mask. Ideally, the diameter of the contact hole and the width of the wiring pattern are equal to each other and the wiring pattern should be formed immediately over the contact hole. However, due to a positioning error which is inevitably introduced, the contact hole and the wiring pattern do not coincide and the photoresist layer may only cover a portion of the Al layer in the contact hole. Hence, when the conventional RIE is carried out by using the chlorine ($Cl_2$) based reactive gas, the impurity region in the semiconductor substrate under the contact hole is easily etched and the etching may progress for the entire depth of the impurity region to thereby cause a short circuit. For this reason, the wiring pattern is conventionally formed with a certain margin, that is, the wiring pattern is dilated at the contact hole, so as to prevent such a short circuit. As a result, there is a problem in that the dilated wiring pattern prevents the improvement of the integration density of the semiconductor device.

There is also the case where a PSG layer is formed on a first Al layer, and a second Al layer is formed on the PSG layer and over a contact hole in the PSG layer, and a photoresist layer is formed on the second Al layer. The photoresist layer is patterned in accordance with the wiring pattern which is to be formed, and the wiring pattern of the second Al layer is formed by the RIE using the photoresist layer as a mask. However, due to reasons similar to those described above, the first Al layer is easily etched and the etching may progress for the entire depth of the first Al layer when the conventional RIE is carried out by using the $Cl_2$ based reactive gas.

In the LSIs and very large scale integrated circuits (VLSIs) having the metal oxide semiconductor (MOS) structure, polysilicon is used to form a gate electrode by self-alignment. The resistivity of polysilicon is reduced by controlling the doping and grain size of the impurity, but the limit of the reduction of the resistivity is approximately 500 $\mu\Omega$ cm. Hence, in order to improve the conductivity, a two-layer construction comprising the polysilicon layer and a metal of silicon and a refractory metal. As known metal silicides, there are titanium silicide ($TiSi_2$) having a resistivity in the range of 13 $\mu\Omega$ cm to 16 $\mu\Omega$ cm, tungsten silicide ($WSi_2$) having a resistivity in the order of 70 $\mu\Omega$ cm, and molybdenum silicide ($MoSi_2$) having a resistivity in the order of 100 $\mu\Omega$ cm. These metal silicides have high melting temperature and high oxidation resistance, and have properties similar to those of silicon.

As another example of the use of the RIE, there is the case where the RIE is carried out a plurality of times when producing an erasable programmable read only memory (EPROM). A first polysilicon layer is formed on an oxide layer which is formed on a silicon (Si) substrate. Next, a silicon dioxide ($SiO_2$) layer, a second polysilicon layer and metal silicide layer are successively formed on the first polysilicon layer. When forming a gate electrode, a photoresist layer is formed on the metal silicide layer and is then patterned, and the fluorine or chlorine based gas is used as the reactive gas to etch the metal silicide layer and the second polysilicon layer by the RIE. The difference between the etching rates of metal silicide and polysilicon is small, and the metal silicide layer and the second polysilicon layer can be etched satisfactorily. Thereafter, the reactive gas is changed to $CHF_3$ to etch the $SiO_2$ layer by the RIE, and the original reactive gas is used again to etch the first polysilicon layer so as to complete the formation of the gate electrode.

When forming the gate electrode, the photoresist layer must withstand the three selective etching processes, however, in actual practice, the photoresist layer cannot withstand all of the etching processes. As a result, there is a problem in that the dimensional accuracy and reliability of the gate electrode becomes poor due to the damaged photoresist layer.

Accordingly, there is a demand to realize a method of producing a semiconductor device using the RIE in which it is possible to improve the patterning accuracy and the integration density.

SUMMARY OF THE INVENTION

Accordingly, it is a general object of the present invention to provide a novel and useful method of producing a semiconductor device in which the problems described heretofore are eliminated and the above described demand is satisfied.

Another and more specific object of the present invention is to provide a method of producing a semiconductor device comprising the steps of forming on a substrate a layer of a material selected from a group consisting of aluminum, aluminum alloy, titanium, polysilicon and a metal silicide, and carrying out a dry etching of the layer in a reactive gas consisting essentially of bromine gas. According to the method of the present invention, it is possible to improve the patterning accuracy and hence improve the integration density of the semiconductor device.

Still another object of the present invention is to provide a method of producing a semiconductor device comprising the steps of forming a contact hole in an insulator layer which is formed on a semiconductor substrate having an impurity region immediately under the contact hole, filling the contact hole by a material selected from a group consisting of tungsten, tungsten silicide, molybdenum, molybdenum silicide, tantalum, and tantalum silicide, forming over the insulator layer and the contact hole a polycide layer made up of a first layer made of titanium silicide and a second layer made of polysilicon, forming a photoresist pattern on the polycide layer, carrying out a dry etching of the polycide layer in a reactive gas consisting essentially of bromine gas by use of the photoresist pattern as a mask to thereby form a wiring pattern on the semiconductor substrate, so that the material filling the contact hole substantially acts as a protective mask for the impurity region during the dry etching. According to the method of the present invention, the wiring pattern need not be formed with a certain margin as in the conventional case in order to prevent a short circuit, that is, the wiring pattern need not be dilated at the contact hole. As a result, it becomes unnecessary to take measures against the positioning error, and the integration density of the semiconductor device is accordingly improved.

A further object of the present invention is to provide a method of producing a semiconductor device comprising the steps of forming a contact hole in an insulator layer which is formed on a first conductor layer consisting essentially of a material selected from a group of aluminum, aluminum alloy, titanium, titanium silicide and polysilicon, filling the contact hole by a material selected from a group consisting of tungsten, tungsten silicide, molybdenum, molybdenum silicide, tantalum, and tantalum silicide, forming over the insulator layer and the contact hole a second conductor layer consisting essentially of a material selected from a group of aluminum, aluminum alloy, titanium, titanium silicide and polysilicon, forming a photoresist pattern on the second conductor layer, carrying out a dry etching of the second conductor layer in a reactive gas consisting essentially of bromine gas by use of the photoresist pattern as a mask to thereby form a wiring pattern of the second conductor layer, so that the material filling the contact hole substantially acts as a protective mask for the first conductor layer during the dry etching.

Another object of the present invention is to provide a method of producing a semiconductor device comprising the steps of successively forming on a semiconductor substrate an oxide layer, a first polysilicon layer, a silicon dioxide layer, a second polysilicon layer and a metal silicide layer consisting essentially of a material selected from a group of tungsten silicide, molybdenum silicide and tantalum silicide, forming a photoresist pattern on the metal silicide layer, carrying out a first dry etching of the metal silicide layer and the second polysilicon layer by using the photoresist pattern as a mask, removing the photoresist pattern on the metal silicide layer and the second polysilicon layer which remain after the first dry etching, carrying out a second dry etching of the silicon dioxide layer by using the remaining metal silicide layer as a mask, and carrying out a third dry etching of the first polysilicon layer in a reactive gas consisting essentially of bromine gas by use of the remaining metal silicide layer as a mask to thereby form a gate electrode on the semiconductor substrate. According to the method of the present invention, the metal silicide layer effectively acts as the mask when the first polysilicon layer is etched by the third dry etching using the the reactive gas, since the etching rate of the metal silicide is considerably low compared to the etching rate of polysilicon. The gate electrode is thus formed with a high accuracy because the mask used for each dry etching is undamaged.

Other objects and further features of the present invention will be apparent from the following detailed description when read in conjunction with the accompanying drawings.

DETAILED DESCRIPTION

Figure 1A:
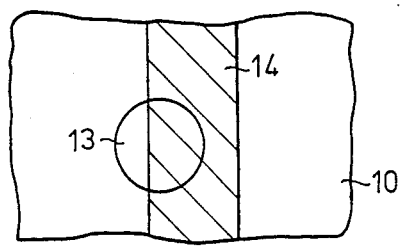
FIGS. 1A through 1D are a plan view and cross sectional views for explaining the conventional methods of forming a wiring pattern.
Figure 1B:
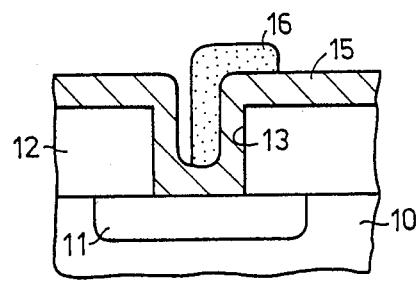
Figure 1C:
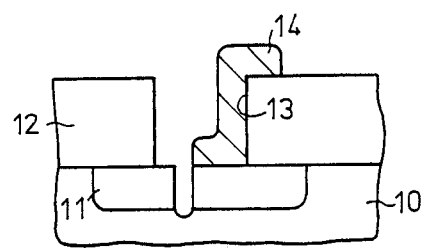
Figure 2:
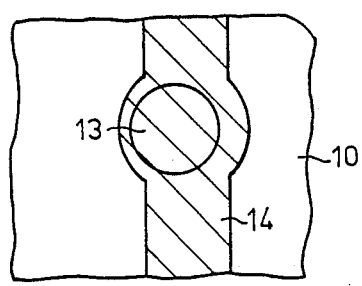
FIG. 2 is a plan view showing the conventional wiring pattern.

As one example of the use of the RIE, there is the case where a wiring pattern 14 is formed by the RIE as shown in FIGS. 1A through 1C. In this case, an Al layer 15 is formed on a PSG layer 12 and over a contact hole 13 in the PSG layer 12, and a photoresist layer 16 is formed on the Al layer 15. The PSG layer 12 is formed on a semiconductor substrate 10, and an impurity region 11 is formed in the semiconductor substrate 10 under the contact hole 13. The photoresist layer 16 is patterned in accordance with the wiring pattern 14 which is to be formed, and the wiring pattern 14 of the Al layer 15 is formed by the RIE using the photoresist layer 16 as a mask. Ideally, the diameter of the contact hole 13 and the width of the wiring pattern 14 are equal to each other and the wiring pattern 14 should be formed immediately over the contact hole 13. However, due to a positioning error which is inevitably introduced, the contact hole 13 and the wiring pattern 14 do not coincide and the photoresist layer 16 may only cover a portion of the Al layer 15 in the contact hole 13. Hence, when the conventional RIE is carried out by using the fluorine or chlorine based reactive gas, the impurity region 11 in the semiconductor substrate 10 under the contact hole 13 is easily etched and the etching may progress for the entire depth of the impurity region 11 as shown in FIG. 1C to thereby cause a short circuit. For this reason, the wiring pattern 14 is conventionally formed with a certain margin, that is, the wiring pattern 14 is dilated at the contact hole 13 as shown in FIG. 2, so as to prevent such a short circuit. As a result, there is a problem in that the dilated wiring pattern 14 prevents the improvement of the integration density of the semiconductor device.

Figure 1D:
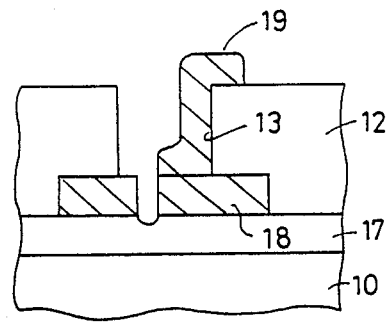

A similar problem occurs when the PSG layer 12 is formed on a first Al layer 18 on a PSG layer 17, a second Al layer 19 is formed on the PSG layer 12 and over the contact hole 13 in the PSG layer 12, and a photoresist layer (not shown) is formed on the second Al layer 19. The photoresist layer is patterned in accordance with the wiring pattern which is to be formed, and the wiring pattern of the second Al layer 19 is formed by the RIE using the photoresist layer as a mask. However, due to reasons similar to those described above, the first Al layer 18 is easily etched and the etching may progress for the entire depth of the first Al layer 18 as shown in FIG. 1D when the conventional RIE is carried out by using the $Cl_2$ based reactive gas.

Figure 3A:
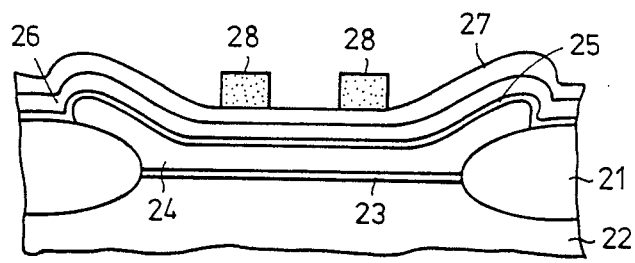
FIGS. 3A and 3B are cross sectional views for explaining the conventional method of producing an EPROM.
Figure 3B:
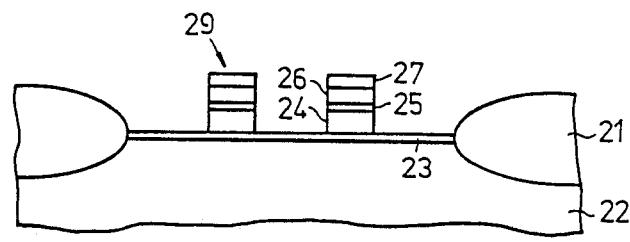
Figure 4:
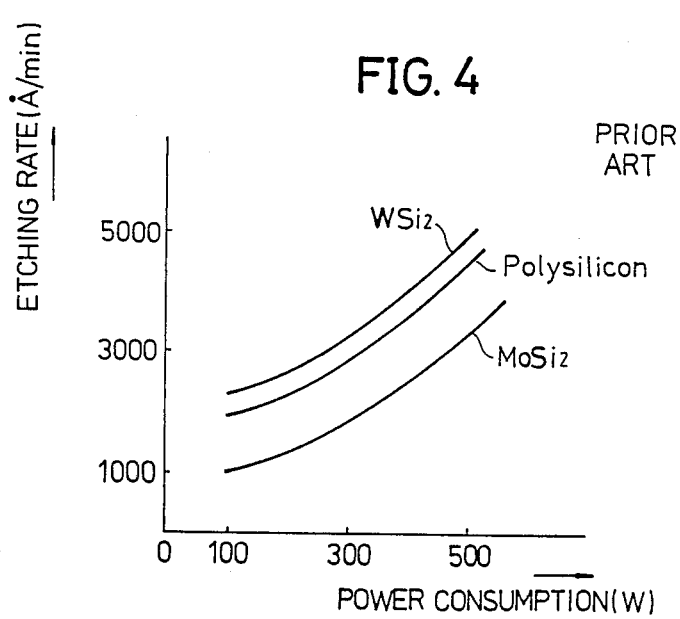
FIG. 4 is a graph showing etching rate versus power consumption characteristics for explaining the conventional RIE using fluorine or chlorine based gas as the reactive gas.

As another example of the use of the RIE, there is the case where the RIE is carried out a plurality of times when producing an EPROM. As shown in FIG. 3A, a first polysilicon layer 24 is formed on an oxide layer 23 which is formed on a Si substrate 22. Next, a $SiO_2$ layer 25, a second polysilicon layer 26 and a metal silicide layer 27 are successively formed on the first polysilicon layer 24. In FIGS. 3A and 3B, a field oxide layer 21 is formed to isolate cells of the EPROM part. When forming a gate electrode 29 shown in FIG. 3B, a photoresist layer 28 is formed on the metal silicide layer 27 and is then patterned, and the fluorine or chlorine based gas is used as the reactive gas to etch the metal silicide layer 27 and the second polysilicon layer 26 by the RIE using the photoresist layer 28 as a mask. In this case, the difference between the etching rates of metal silicide and polysilicon is small as shown in FIG. 4, and the metal silicide layer 27 and the second polysilicon layer 26 can be etched satisfactorily. Thereafter, the reactive gas is changed to $CHF_3$ to etch the $SiO_2$ layer 25 by the RIE, and the original reactive gas is used again to etch the first polysilicon layer 24 so as to complete the formation of the gate electrode 29.

When forming the gate electrode 29, the photoresist layer 28 must withstand the three selective etching processes, however, in actual practice, the photoresist layer 28 cannot withstand all of the etching processes. As a result, there is a problem in that the dimensional accuracy and reliability of the gate electrode 29 becomes poor due to the damaged photoresist layer 28.

Accordingly, there is a demand to realize a method of producing a semiconductor device using the RIE in which it is possible to improve the patterning accuracy and the integration density.

As described before, the conventional RIE uses the fluorine or chlorine based gas as the reactive gas. In this case, the etching rate of polysilicon and the etching rate of metal silicide are similar to each other as shown in FIG. 4. For example, the etching rate of polysilicon is approximately twice the etching rate of $MoSi_2$, but such a difference between the etching rates of polysilicon and metal silicide is virtually a maximum difference that occurs.

Figure 5:
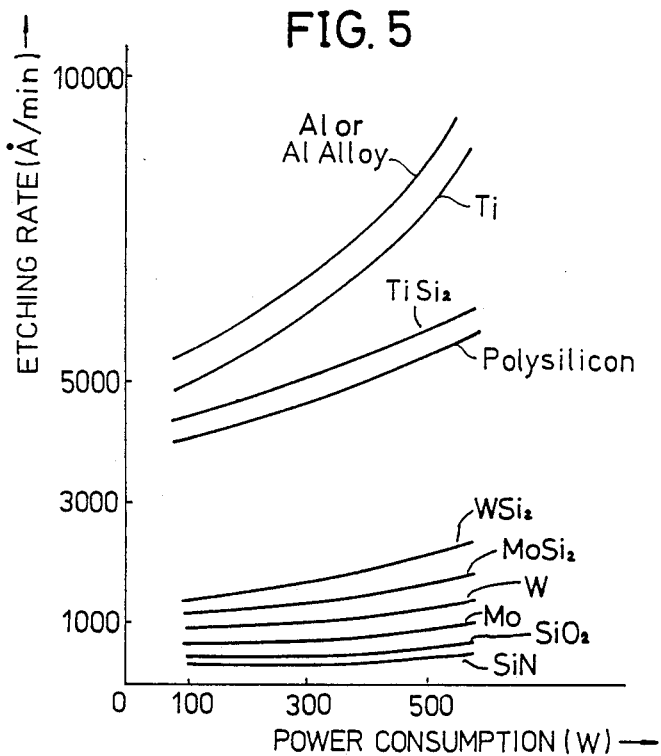
FIG. 5 is a graph showing etching rate versus power consumption characteristics for explaining the RIE using a predetermined gas which at least includes bromine gas as the reactive gas.

On the other hand, the present inventors have found that when the RIE is carried out by use of a gas, the etching rate is slightly slower than the etching rate obtained by use of the fluorine or chlorine based gas as the reactive gas but there is a considerable difference between the etching rates of materials. FIG. 5 shows the etching rates of various materials when the gas which at least includes bromine gas is used as the reactive gas. It may be seen from FIG. 5 that the etching rates of Al (or Al alloy), titanium (Ti), $TiSi_2$ and polysilicon are high compared to the etching rates of $WSi_2$, $MoSi_2$, tantalum silicide ($TaSi_2$), molybdenum (Mo), tungsten (W), tantalum (Ta), silicon nitride (SiN) and $SiO_2$. The present invention effectively utilizes the large difference between the etching rates of two materials when the RIE is carried out by use of the gas which at least includes bromine gas as the reactive gas, so as to improve the patterning accuracy and the integration density. Although the etching rates of Ta and $TaSi_2$ are not shown in FIG. 5 for convenience' sake, the etching rate of Ta is approximately the same as that of $SiO_2$, and the etching rate of $TaSi_2$ is between those of $MoSi_2$ and W.

The characteristics shown in FIG. 5 are basically the same for the case where the bromine gas alone is used as the reactive gas and the case where the bromine gas mixed with an inert gas such as helium (He) gas, argon (Ar) gas, neon (Ne) gas, krypton (Kr) gas, xenon (Xe) gas and radon (Rn) gas is used as the reactive gas. The reactive gas may be constituted by the bromine gas and the inert gas mixed with a predetermined ratio.

Figure 6A:
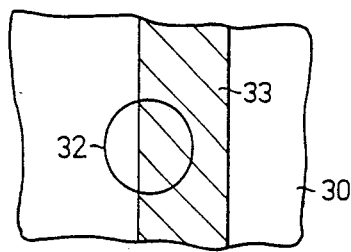
FIGS. 6A through 6C are a plan view and cross sectional views for explaining a first embodiment of the method according to the present invention applied to the formation of a wiring pattern.
Figure 6B:
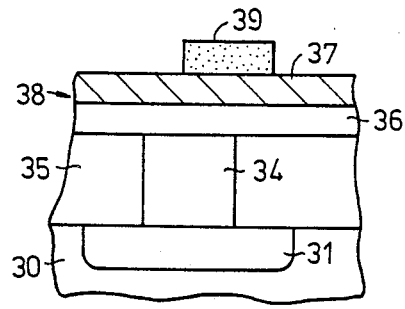
Figure 6C:
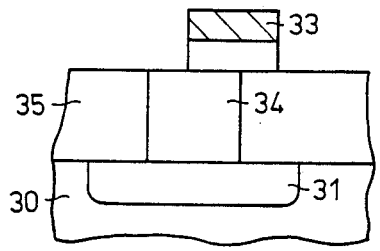

FIGS. 6A through 6C are a plan view and cross sectional views for explaining a first embodiment of the method according to the present invention applied to the formation of a wiring pattern. When forming a wiring pattern 33 over a contact hole 32, the contact hole 32 is filled with a material 34 such as a metal or metal silicide. In the present embodiment, $WSi_2$ is used as the material 34. A polycide layer 38 made up of a polysilicon layer 36 and a $TiSi_2$ layer 37 is formed on a PSG layer 35 and over the contact hole 32 in the PSG layer 35, and a photoresist layer 39 is formed on the polycide layer 37 similarly as in the case of the conventional case shown in FIG. 1B. The PSG layer 35 is formed on a semiconductor substrate 30, and an impurity region 31 is formed in the semiconductor substrate 30 under the contact hole 32. The photoresist layer 39 is patterned in accordance with the wiring pattern 33 which is to be formed, and the wiring pattern 33 of the polycide layer 38 is formed by the RIE using the photoresist layer 39 as a mask and a gas which at least includes bromine gas as the reactive gas.

Ideally, the diameter of the contact hole 32 and the width of the wiring pattern 33 are equal to each other and the wiring pattern 33 should be formed immediately over the contact hole 32. However, due to a positioning error which is inevitably introduced, the contact hole 32 and the wiring pattern 33 do not coincide and the photoresist layer 39 may only cover a portion of the polycide layer 38 at the contact hole 32. When the RIE is carried out by using the gas which at least includes bromine gas as the reactive gas, the polycide layer 38 is easily etched because the etching rates of polysilicon and $TiSi_2$ are high, but the material ($WSi_2$ in the present embodiment) 34 will only be etched to a negligible extent because the etching rate of $WSi_2$ is considerably low compared to those of the polysilicon layer 36 and the $TiSi_2$ layer 37. As a result, the impurity region 31 in the semiconductor substrate 30 under the contact hole 32 is protected by the metal silicide 37 and will not be etched.

For this reason, the wiring pattern 33 need not be formed with a certain margin as in the conventional case in order to prevent a short circuit, that is, the wiring pattern 33 need not be dilated at the contact hole 32. As a result, it becomes unnecessary to take measures against the positioning error, and the integration density of the semiconductor device is accordingly improved.

Figure 6D:
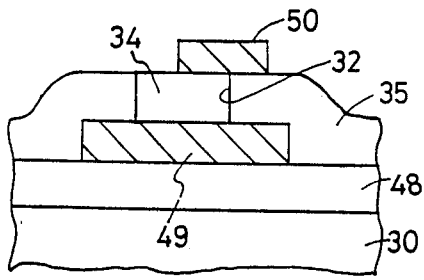
FIG. 6D is a cross sectional view showing a modification of the first embodiment.

The present invention is not limited to the formation of the wiring pattern over the contact hole 32 under which the impurity region 31 exists, and the wiring pattern may be formed over the contact hole 32 under which a conductor layer exists. FIG. 6D shows a modification of the first embodiment. In FIG. 6D, those parts which are the same as those corresponding parts in FIG. 6C are designated by the same reference numerals, and description thereof will be omitted. A PSG layer 48 is formed on the semiconductor substrate 30, a first Al conductor layer 49 is formed on the PSG layer 48, the PSG layer 35 is formed on the first Al conductor layer 49, a second Al conductor layer 50 is formed on the PSG layer 35 and over the material 34 filling the contact hole 32. A wiring pattern of the second Al conductor layer 50 is formed similarly as in the case of the wiring pattern 33 described above.

Figure 7:
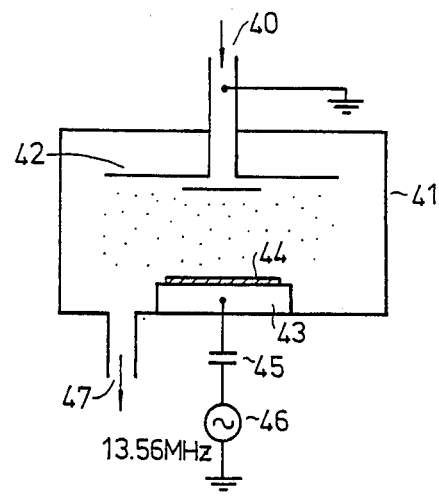
FIG. 7 is a diagram for explaining the RIE.

FIG. 7 shows an embodiment of an etching chamber which may be used for the RIE using the gas which at least includes the bromine gas as the reactive gas. The gas which at least includes bromine is supplied to an etching chamber 41 via an input port 40. An anode 42 and a cathode 43 are provided inside the etching chamber 41. A semiconductor substrate 44 which is to be subjected to the RIE is placed on the cathode 43. The cathode 43 is coupled to a radio frequency generator 46 via a blocking capacitor 45. The radio frequency generator 46 generates a high frequency voltage of 13.56 MHz in the present embodiment, but it is of course possible to use a radio frequency generator which generates a high frequency voltage in the order of 100 kHz to 500 kHz. An output port 47 is coupled to an evacuation pump (not shown) for evacuating the gas from the etching chamber 41. For example, the pressure inside the etching chamber 41 is approximately 1 mTorr to 500 mTorr, and the etching power is approximately 0.1 $W/cm^2$ to 5 $W/cm^2$. In the present embodiment, the reactive gas comprises bromine gas mixed with helium gas which is an inert gas, and the two are mixed with a 1:1 ratio, for example. The flow rate of bromine gas is approximately 10 cc/min (or SCCM) to 100 cc/min, and the flow rate of helium is approximately 10 cc/min to 100 cc/min.

When the $Br_2$+He gas is used as the reactive gas for the RIE, it is possible to more positively protect during the RIE the photoresist layer which cannot withstand high heat.

Figure 8A:
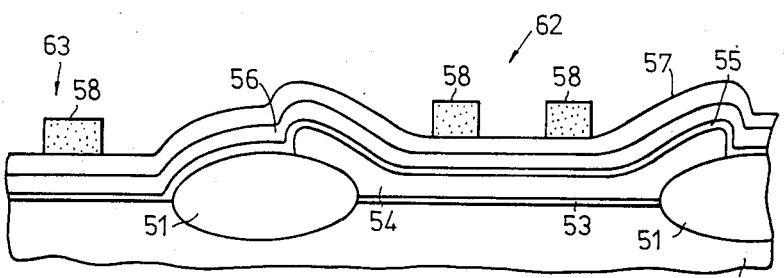
FIGS. 8A through 8E are cross sectional views for explaining a second embodiment of the method according to the present invention applied to the production of an EPROM.

FIGS. 8A through 8E are cross sectional views for explaining a second embodiment of the method according to the present invention applied to the production of an EPROM. As shown in FIG. 8A, a first polysilicon layer 54 is formed on an oxide layer 53 which is formed on a Si substrate 52. Next, a $SiO_2$ layer 55, a second polysilicon layer 56 and a metal silicide layer 57 are successively formed on the first polysilicon layer 54. A field oxide layer 51 is formed to isolate cells of an EPROM part 62. In the present embodiment, $WSi_2$ is used for the metal silicide layer (hereinafter referred to as $WSi_2$ layer) 57.

Figure 8B:
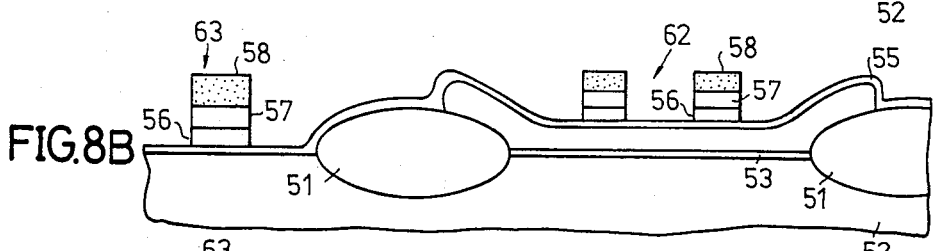
Figure 8C:
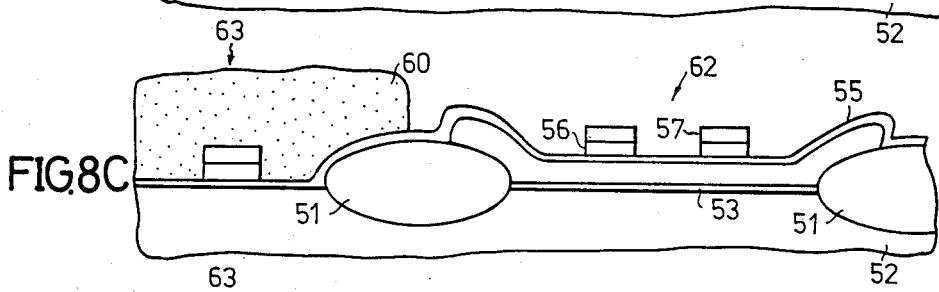
Figure 8D:
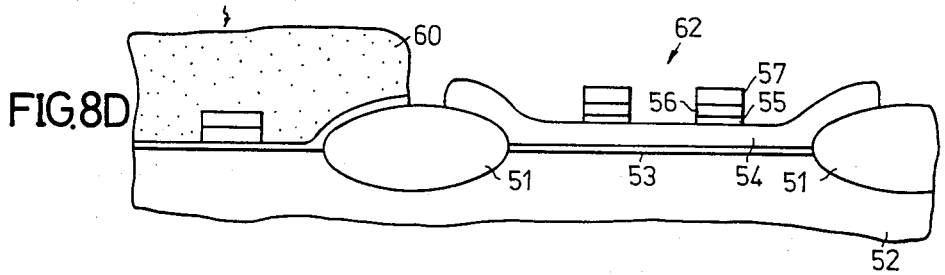
Figure 8E:
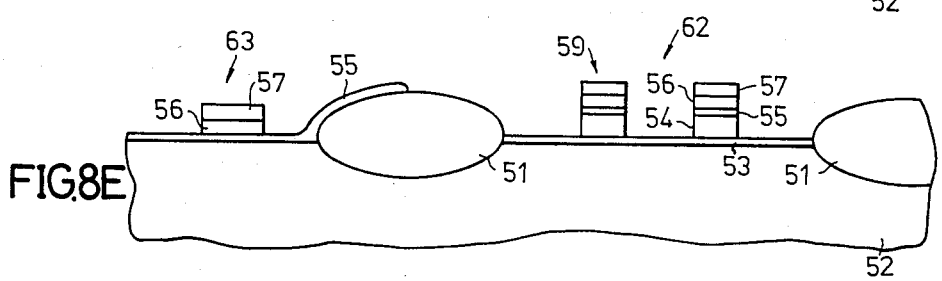

When forming a gate electrode 59 shown in FIG. 8E, a photoresist layer 58 is formed on the $WSi_2$ layer 57 and is then patterned as shown in FIG. 8A. Fluorine or chlorine based gas is used as the reactive gas to etch the $WSi_2$ layer 57 and the second polysilicon layer 56 by the RIE using the photoresist layer 58 as a mask. In this case, the difference between the etching rates of $WSi_2$ and polysilicon is small as shown in FIG. 4, and the $WSi_2$ layer 57 and the second polysilicon layer 56 can be etched satisfactorily as shown in FIG. 8B.

Next, the photoresist layer 58 is removed, and a photoresist layer 60 is formed over the peripheral circuit part 63 as shown in FIG. 8C.

Then, $CF_4$+$CHF_3$ gas is used as the reactive gas to etch the $SiO_2$ layer 55 by the RIE using the $WSi_2$ layer 57 as a mask, as shown in FIG. 8D. Since the etching rate of $WSi_2$ is considerably low compared to that of $SiO_2$ when the RIE is carried out by use of the $CF_4$+$CHF_3$ gas, the $WSi_2$ layer 57 properly acts as the mask and only the $SiO_2$ layer is etched. The peripheral circuit part 63 is protected by the photoresist layer 60 during this RIE.

Thereafter, a gas which at least includes bromine gas is used as the reactive gas to etch the first polysilicon layer 54 at the RIE using the $WSi_2$ layer 57 as a mask, as shown in FIG. 8E. Further, the photoresist layers 60 and 58 on the peripheral circuit part 63 are removed. As a result, the gate electrode 59 is formed on the substrate 52 by the self-alignment. Since the etching rate of $WSi_2$ is considerably low compared to the etching rate of polysilicon as shown in FIG. 5, the $WSi_2$ layer 57 effectively acts as the mask when the first polysilicon layer 54 is etched by the RIE using the gas which at least includes bromine gas as the reactive gas. The gate electrode 59 is formed with a high accuracy because the mask used for each RIE is undamaged.

The combination of the two materials having the considerably different etching rates when the RIE is carried out by use of the gas which at least includes bromine gas is not limited to the combinations of the embodiments described heretofore. For example, as may be seen from FIG. 5, any material selected from a group of Al, Al alloy, Ti, TiSi$_2$ and polysilicon may be used as the material with the high etching rate, and any material selected from a group of WSi$_2$, MoSi$_2$, TaSi$_2$, Mo, W, Ta, SiN and SiO$_2$ may be used as the material with the low etching rate.

Further, the present invention is not limited to these embodiments, but various variations and modifications may be made without departing from the scope of the present invention.

What is claimed is:

1. A method of producing a semiconductor device comprising the steps of:
    forming a contact hole in an insulator layer which is formed on a semiconductor substrate, said semiconductor substrate having an impurity region immediately under said contact hole;
    filling said contact hole by a material selected from a group consisting of tungsten, tungstem silicide, molybdenum, molybdenum silicide, tantalum, and tantalum silicide;
    forming a polycide layer over said insulator layer and said contact hole, said polycide layer being made up of a first layer made of titanium silicide and a second layer made of polysilicon;
    forming a photoresist pattern on said polycide layer;
    carrying out a dry etchign of said polycide layer in a reactive gas consisting essentially of bromine gas by use of said photoresist pattern as a mask to thereby form a wiring pattern on said semiconductor substrate, so that said material filling said contact hole substantially acts as a protective mask for said impurity reigon during said dry etching.

2. A method of producing a semiconductor device as claimed in claim 1 wherein said dry etching is carried out in a gas consisting of said reactive gas and an inert gas.

3. A method of producing a semiconductor device as claimed in claim 2 wherein said inert gas is argon gas, helium gas, neon gas, krypton gas, xenon gas or radon gas.

4. A method of producing a semiconductor device as claimed in claim 1 wherein said dry etching is carried out by a reactive ion etching method.

5. A method of producing a semiconductor device comprising the steps of:
    forming a contact hole in an insulator layer which is formed on a first conductor layer, said first conductor layer consisting essentially of a material selected from a group of aluminum, aluminum alloy, titanium, titanium silicide and polysilicon;
    filling said contact hole by a material selected form a group consisting of tungsten, tungsten silicide, molybdenum, molydenum silicide, tantalum, and tantalum silicide;
    forming a second conductor layer over said insulator layer and said contact hole, said second conductorlayer consisting essentially of a material selected from a group of aluminum, aluminum alloy, titanium, titanium silicide and polysilicon;
    forming a photoresist pattern on said second conductor layer;
    carrying out a dry etching of said second conductor layer in a reactive gas conssiting essentially of bromine gas by use of said photoresist pattern as a mask to thereby form a wiring pattern of said second conductor layer, so that said material filling said contact hole substantially acts as a protective mask for said first conductor layer during said dry etching.

6. A method of producing a semiconductor device as claimed in claim 5 wherein said dry etching is carried out in a gas consisting of said reactive gas and an inert gas.

7. A method of producing a semiconductor device as claimed in claim 6 wherein said inert gas is argon gas, helium gas, neon gas, krypton gas, xenon gas or radon gas.

8. A method of producing a semiconductor device as claimed in claim 5 wherein said dry etching is carried out by a reactive ion etching method.

9. A method of producing a semiconductor device comprising the steps of:
    successively forming on a semiconductor substrate an oxide layer, a first polysilicon layer, a silicon dioxide layer, a second polysilicon layer and a metal silicide layer, said metal silicide layer consisting essentially of a material selected from a group of tungsten silicide, molybdenum silicide and tantalum silicide;
    forming a photoresist pattern on said metal silicide layer;
    carrying ou a first dry etching of said metal silicide layer and said second polysilicon layer by using said photoresist pattern as a mask;
    removing said photoresist pattern on said metal silicide layer and said second polysilicon layer which remain after said first dry etching;
    carrying out a second dry etching of said silicon dioxide layer by using said remaining metal silicide layer as a mask; and
    carrying out a third dry etching of said first polysilicon layer in a reactive gas consisting essentially of bromine gas by use of said remaining metal silicide layer as a mask to thereby form a gate electrode on said semiconductor substrate.

10. A method of producing a semiconductor device as claimed in claim 9 wherein said third dry etching is carried out in a gas consisting of said reactive gas and an inert gas.

11. A method of producing a semiconductor device as claimed in claim 10 wherein said inert gas is argon gas, helium gas, neon gas, krypton gas, xenon, gas or radon gas.

12. A method of producing a semiconductor device as claimed in claim 9 wherein said third dry etching is carried out by a reactive ion etching method.

* * * * *